US012740117B2

(12) United States Patent
Someshwar et al.

(10) Patent No.: US 12,740,117 B2
(45) Date of Patent: Sep. 15, 2026

(54) METHODS OF FORMING SEMICONDUCTOR STRUCTURES

(71) Applicant: Applied Materials, Inc., Santa Clara, CA (US)

(72) Inventors: Ria Someshwar, Santa Clara, CA (US); Seshadri Ganguli, San Jose, CA (US); Lan Yu, Voorheesville, NY (US); Siddarth Krishnan, Newark, CA (US); Srinivas Gandikota, Santa Clara, CA (US); Jacqueline S. Wrench, San Jose, CA (US); Yixiong Yang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 364 days.

(21) Appl. No.: 18/411,693

(22) Filed: Jan. 12, 2024

(65) Prior Publication Data

US 2024/0154018 A1 May 9, 2024

Related U.S. Application Data

(63) Continuation of application No. 17/376,504, filed on Jul. 15, 2021, now Pat. No. 11,908,914.

(51) Int. Cl.

*H10D 62/83* (2025.01)
*H10D 30/01* (2025.01)

(Continued)

(52) U.S. Cl.

CPC ......... *H10D 62/83* (2025.01); *H10D 30/0212* (2025.01); *H10D 64/01* (2025.01);

(Continued)

(58) Field of Classification Search

CPC .... H10D 62/83; H10D 30/0212; H10D 64/01; H10D 64/0112; H10D 64/62;

(Continued)

(56) References Cited

U.S. PATENT DOCUMENTS

| | | | | |
|---|---|---|---|---|
| 7,646,046 | B2 | 1/2010 | Russ et al. | |
| 9,431,399 | B1 * | 8/2016 | Alptekin ............ | H10D 30/6219 |

(Continued)

FOREIGN PATENT DOCUMENTS

| | | | |
|---|---|---|---|
| DE | 69121451 | T2 | 2/1997 |
| DE | 102019118061 | A1 | 3/2020 |

(Continued)

OTHER PUBLICATIONS

Machine Translation of DE69121451, 28 pages.
PCT International Search Report and Written Opinion in PCT/US2022/036889 dated Nov. 7, 2022, 10 pages.

*Primary Examiner* — Wael Fahmy
(74) *Attorney, Agent, or Firm* — SERVILLA WHITNEY LLC

(57) ABSTRACT

Methods for forming a semiconductor structure and semiconductor structures are described. The method comprises patterning a substrate to form a first opening and a second opening, the substrate comprising an n transistor and a p transistor, the first opening over the n transistor and the second opening over the p transistor; pre-cleaning the substrate; depositing a titanium silicide (TiSi) layer on the n transistor and on the p transistor by plasma-enhanced chemical vapor deposition (PECVD); optionally depositing a first barrier layer on the titanium silicide (TiSi) layer and selectively removing the first barrier layer from the p transistor; selectively forming a molybdenum silicide (MoSi) layer on the titanium silicide (TiSi) layer on the n transistor and the p transistor; forming a second barrier layer on the molybdenum silicide (MoSi) layer; and annealing the semicon- (Continued)

ductor structure. The method may be performed in a processing chamber without breaking vacuum.

15 Claims, 11 Drawing Sheets

(51) Int. Cl.

| | |
|---|---|
| ***H10D 64/01*** | (2025.01) |
| ***H10D 64/62*** | (2025.01) |
| ***H10D 84/01*** | (2025.01) |
| ***H10D 84/03*** | (2025.01) |
| ***H10P 95/90*** | (2026.01) |

(52) U.S. Cl.

CPC ......... *H10D 64/0112* (2026.01); *H10D 64/62* (2025.01); *H10D 84/017* (2025.01); *H10D 84/038* (2025.01); *H10P 95/90* (2026.01)

(58) Field of Classification Search

CPC ............... H10D 84/017; H10D 84/038; H10D 30/6219; H10D 84/0186; H10D 84/85; H10D 84/0193; H10D 84/853; H10P 95/90; H10W 20/047; H10W 20/035; H10W 20/048; H10W 20/40; H10W 20/081

USPC .......................................................... 257/751

See application file for complete search history.

(56) References Cited

U.S. PATENT DOCUMENTS

| | | | |
|---|---|---|---|
| 9,583,397 | B1 | 2/2017 | Deniz et al. |
| 2016/0247805 | A1 | 8/2016 | Basker et al. |
| 2020/0006159 | A1 | 1/2020 | Shih et al. |
| 2020/0058562 | A1 | 2/2020 | Wu et al. |
| 2020/0091011 | A1 | 3/2020 | Khaderbad et al. |
| 2020/0168716 | A1 | 5/2020 | Peng et al. |
| 2020/0294864 | A1 | 9/2020 | Chu et al. |
| 2020/0303195 | A1 | 9/2020 | Tapily |
| 2021/0098584 | A1 | 4/2021 | Cheng et al. |
| 2021/0119037 | A1 | 4/2021 | Li et al. |
| 2021/0143278 | A1 | 5/2021 | Wang et al. |
| 2021/0272855 | A1 * | 9/2021 | Chen .................... H10D 84/853 |

FOREIGN PATENT DOCUMENTS

| | | | |
|---|---|---|---|
| JP | 2005243664 | A | 9/2005 |
| TW | 201545341 | A | 12/2015 |

* cited by examiner

METHODS OF FORMING SEMICONDUCTOR STRUCTURES

CROSS-REFERENCE TO RELATED APPLICATIONS

This application is a Continuation of and claims priority to U.S. application Ser. No. 17/376,504, filed Jul. 15, 2021, the entire disclosure of which is hereby incorporated by reference herein.

TECHNICAL FIELD

Embodiments of the present disclosure pertain to the field of semiconductor devices and semiconductor device manufacturing. More particularly, embodiments of the disclosure relate to methods of selectively forming silicide layers having ohmic and pseudo-ohmic contacts.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (finFET) structure, and a gate all around (GAA) structure. Logic gate performance is related to the characteristics of the materials used as well as the thickness and area of the structural layers. However, as some gate characteristics are adjusted to accommodate device scaling, challenges arise.

Ohmic or pseudo-ohmic contacts are a key element in achieving low contact resistance at source/drain contacts in transistors. There is a need in the art for methods of selectively forming ohmic and pseudo-ohmic contacts on both nFET and pFET contacts.

SUMMARY

One or more embodiments of the disclosure are directed to a method of forming a semiconductor structure. The method comprises patterning a substrate to form a first opening and a second opening, the substrate comprising an n transistor and a p transistor, the first opening over the n transistor and the second opening over the p transistor;

pre-cleaning the substrate; depositing a titanium silicide (TiSi) layer on the n transistor and on the p transistor by plasma-enhanced chemical vapor deposition (PECVD); optionally depositing a first barrier layer on the titanium silicide (TiSi) layer and selectively removing the first barrier layer from the p transistor; selectively forming a molybdenum silicide (MoSi) layer on the titanium silicide (TiSi) layer on the n transistor and the p transistor; forming a second barrier layer on the molybdenum silicide (MoSi) layer; and annealing the semiconductor structure.

Another embodiment of the disclosure is directed to a method of forming a semiconductor structure. The method comprises patterning a substrate to form a first opening, the substrate comprising an n transistor and a p transistor, the first opening over the n transistor; pre-cleaning the substrate; depositing a titanium silicide (TiSi) layer on the n transistor by plasma-enhanced chemical vapor deposition (PECVD); filling the first opening with a first gapfill material; forming a mask layer on a top surface of the n transistor; patterning the substrate to form a second opening over the p transistor; selectively forming a molybdenum silicide (MoSi) layer on the p transistor; annealing the semiconductor structure; and filling the second opening with a second gapfill material.

Further embodiments of the disclosure are directed to a semiconductor structure. The semiconductor structure comprises an n transistor and a p transistor; a titanium silicide (TiSi) layer on one or more of the n transistor and the p transistor; a molybdenum silicide (MoSi) layer on one or more of the n transistor and the p transistor; optionally, a barrier layer on one or more of the titanium silicide (TiSi) layer and the molybdenum silicide (MoSi) layer; and a gapfill material.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1B:
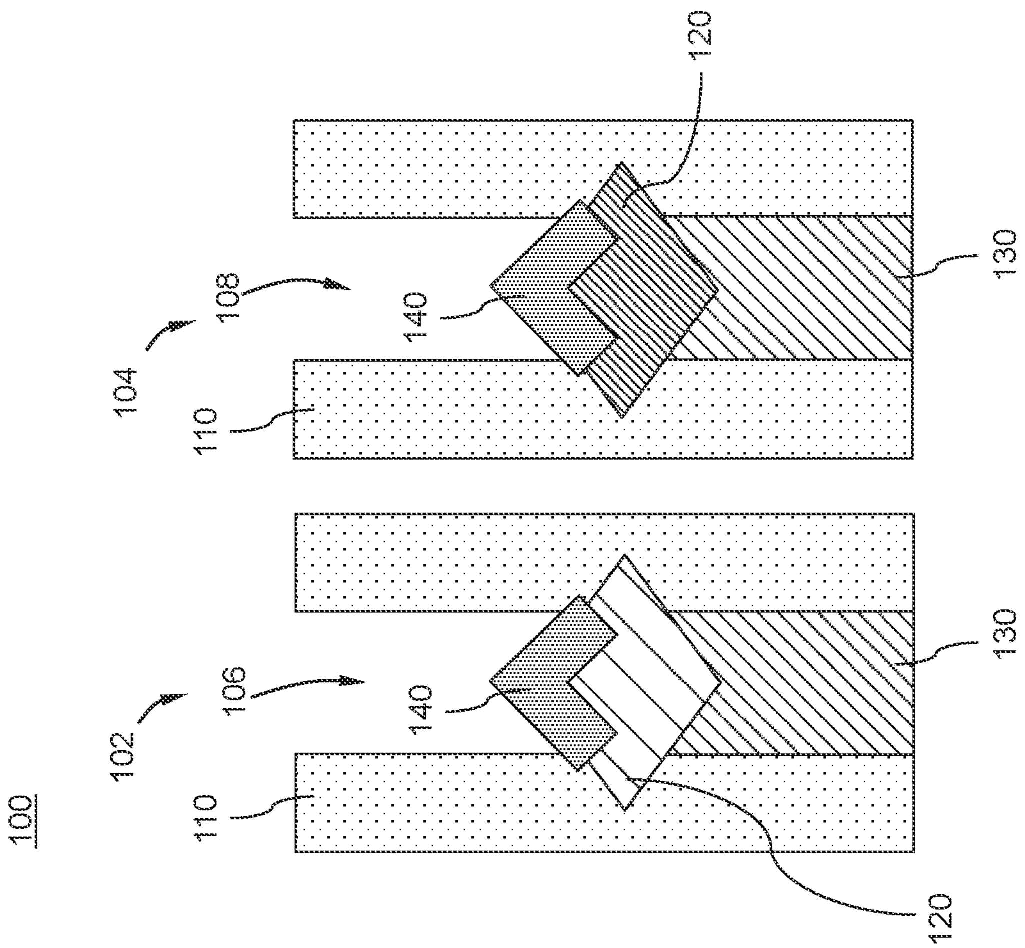
FIG. 1B illustrates a semiconductor structure in accordance with one or more embodiments of the disclosure.
Figure 1A:
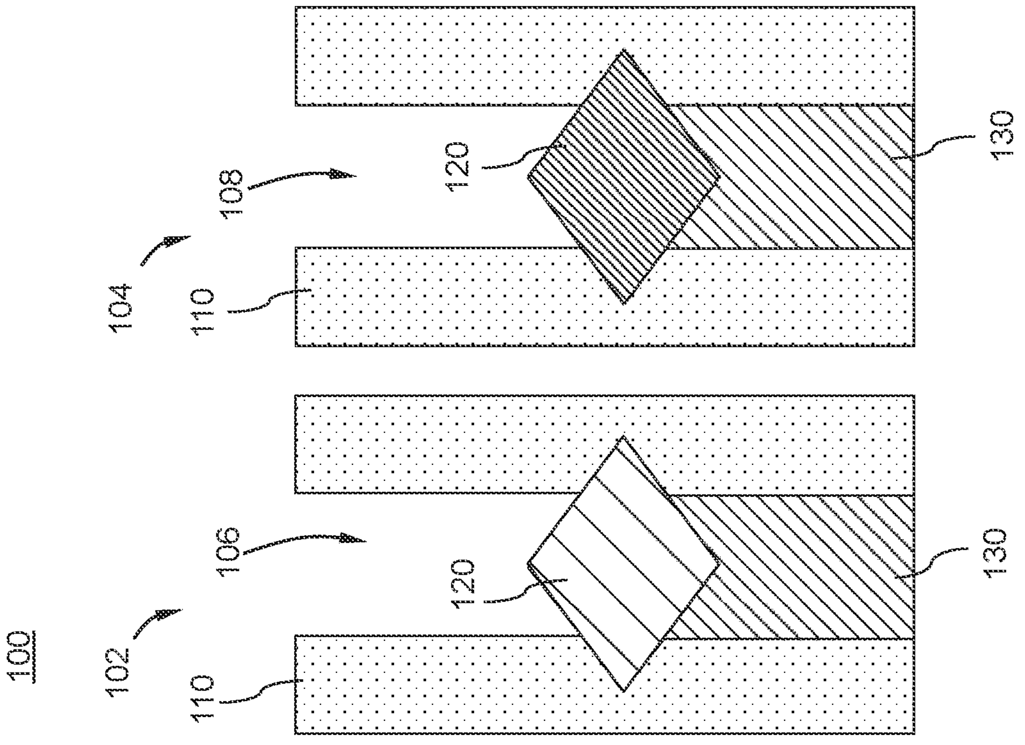
FIG. 1A illustrates a semiconductor structure in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As use herein, the term "substrate," refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

Additionally, the term "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, dielectric materials, other conductive materials, or combinations thereof, depending on the application. In some embodiments, the substrate comprises silicon (Si), ruthenium (Ru), cobalt (Co), tungsten (W), silicon phosphide (SiP), titanium silicon (TiSi), titanium nitride (TiN), titanium aluminide (TiAl), silicon germanium (SiGe), silicon germanium boron (SiGeB), hafnium oxide ($HfO_2$), aluminum oxide ($Al_2O_3$) or combinations thereof. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with an open bottom.

As used herein, the term "processing chamber" includes portions of a processing chamber adjacent the substrate surface without encompassing the complete interior volume of the processing chamber. For example, in a sector of a spatially separated processing chamber, the portion of the processing chamber adjacent the substrate surface is purged of one or more reactive compounds by any suitable technique including, but not limited to, moving the substrate through a gas curtain to a portion or sector of the processing chamber that contains none or substantially none of the reactive compounds.

As used herein, the term "atomic layer deposition" or "cyclical deposition" refers to the sequential exposure of two or more reactive compounds to deposit a layer of material on a substrate surface. The substrate, or portion of the substrate surface is exposed sequentially to the two or more reactive compounds which are introduced into a reaction zone of a processing chamber. The sequential exposure of the reactive gases prevents or minimizes gas phase reactions between the reactive gases. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In one or more embodiments, the time-domain ALD process can be performed with more than two reactive compounds in a predetermined sequence.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. In one or more embodiments, the spatial ALD process can be performed with more than two reactive compounds in a predetermined sequence.

In some embodiments, the substrate surface is exposed to the first reactive compound and the second reactive compound substantially sequentially. As used herein throughout the specification, "substantially sequentially" means that most of the duration of the first reactive compound exposure does not overlap with the second reactive compound exposure, although there may be some overlap.

As used herein, the term "chemical vapor deposition" refers to the exposure of at least one reactive compound to deposit a layer of material on the substrate surface. In some embodiments, the chemical vapor deposition (CVD) process comprises mixing the two or more reactive compounds in the processing chamber to allow gas phase reactions of the reactive compounds and deposition. In some embodiments, the CVD process comprises exposing the substrate surface to two or more reactive compounds simultaneously. In some embodiments, the CVD process comprises exposing the substrate surface to a first reactive compound continuously with an intermittent exposure to a second reactive compound. In some embodiments, the substrate surface undergoes the CVD reaction to deposit a film having a predetermined thickness. In the CVD process, the film can be deposited in one exposure to the mixed reactive compounds, or can be multiple exposures to the mixed reactive compounds with purges between. In some embodiments, the substrate surface is exposed to the first reactive compound and the second reactive compound substantially simultaneously.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive compound is purged from the reaction chamber for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive compound.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is and should not be construed or interpreted as limiting the scope of the embodiments described herein.

As used herein, the terms "liner" or "barrier layer" refer to a layer conformably formed along at least a portion of the sidewalls and/or lower surface of an opening such that a substantial portion of the opening prior to the deposition of the layer remains unfilled after deposition of the layer. The liner may be formed along the entirety of the sidewalls and lower surface of the opening. The liner can be formed by any process known to a person skilled in the art. In some embodiments, the liner comprises a metal nitride, a PVD metal or combinations thereof.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

Embodiments of the disclosure provide semiconductor structures and methods for forming a semiconductor structure. Ohmic and/or pseudo-ohmic contacts are a key element in achieving low contact resistance for source/drain contacts. One or more embodiments advantageously provide integration schemes to produce dual silicides to create ohmic/pseudo-ohmic contacts on both the nFET and pFET contacts.

The embodiments of the disclosure are described by way of the Figures, which illustrate processes for forming dual silicides on ohmic/pseudo-ohmic contacts on both the nFET and pFET contacts. With reference to FIGS. 1A-1E, a semiconductor structure 100 is shown. The semiconductor structure 100 comprises an n transistor 102 and a p transistor 104. In one or more embodiments, each of the n transistor 102 and the p transistor 104 comprise a dielectric material 110, a source/drain material 120, and a substrate 130.

In one or more embodiments, the dielectric material 110 may comprise any suitable dielectric material known to the skilled artisan. In some embodiments, the dielectric material 110 comprises one or more of silicon, silicon oxide, silicon nitride, silicon carbide, and low-K dielectrics. As used herein, terms such as "silicon oxide" and "silicon nitride" refer to materials comprising silicon and oxygen or silicon and nitrogen. "Silicon oxide" and "silicon nitride" should not be understood to imply any stoichiometric ratio. Stated differently, a dielectric material comprising silicon oxide or silicon nitride may be stoichiometric or non-stoichiometric, silicon-rich or silicon-poor. In some embodiments, the dielectric material 110 comprises silicon oxide ($SiO_2$).

In some embodiments, the n transistor 102 and the p transistor 104 comprise source and drain contacts. In one or more embodiments, the source/drain material 120 may have more than one layer. In some embodiments, the source/drain material 120 comprises a layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In one or more specific embodiments, the source/drain material 120 of the n transistor 102 comprises silicon (Si) doped with phosphorous (P). In one or more embodiments, the source/drain material 120 of the n transistor 102 has a bandgap in a range of about 1.0 eV to about 1.2 eV.

In one or more embodiments, the source/drain material 120 of the p transistor 104 comprises silicon germanium (SiGe) doped with boron (B). In one or more embodiments, the source/drain material 120 of the p transistor 104 has a bandgap in a range of about 0.5 eV to about 1.0 eV.

Referring to FIGS. 1A-1D, there is a first opening 106 over the n transistor 102, and there is a second opening 108 over the p transistor 104. The first opening and the second opening can have any suitable aspect ratio (ratio of the depth of the opening to the width of the opening). In one or more embodiments, the first opening and the second opening may independently have an aspect ratio in a range of from 3:1 to 15:1, from 6:1 to 15:1, from 9:1 to 15:1, from 12:1 to 15:1, or an aspect ratio greater than 10:1.

In one or more embodiments, the structure (or surface of the structure) 100 is cleaned. In some embodiments, cleaning the structure 100 removes oxides from the surface. In some embodiments, the oxides are native oxides. In some embodiments, cleaning the surface forms a surface that is substantially free of oxides. As used in this manner, the term "substantially free of oxides" means that there are less than or equal to 5%, 2%, 1% or 0.5% of oxygen atoms on the surface. In one or more embodiments, anisotropic etching is used to remove oxide from the surface. In one or more embodiments, anisotropic etching removes oxide more from the surface of the source/drain material 120 than the dielectric material 110. In one or more embodiments, cleaning the structure forms a source/drain material 120 that is substantially free of oxide.

With reference to FIG. 1B, a titanium silicide (TiSi) layer 140 is deposited on each of the n transistor 102 and the p transistor 104. The titanium silicide layer 140 may have any suitable thickness. In some embodiments, the titanium silicide layer 140 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the titanium silicide (TiSi) layer 140 has a thickness of about 40 Å. The titanium silicide (TiSi) layer 140 on the n transistor 102 has a Schottky barrier height in a range of from about 0.4 eV to about 0.55 eV.

Figure 1C:
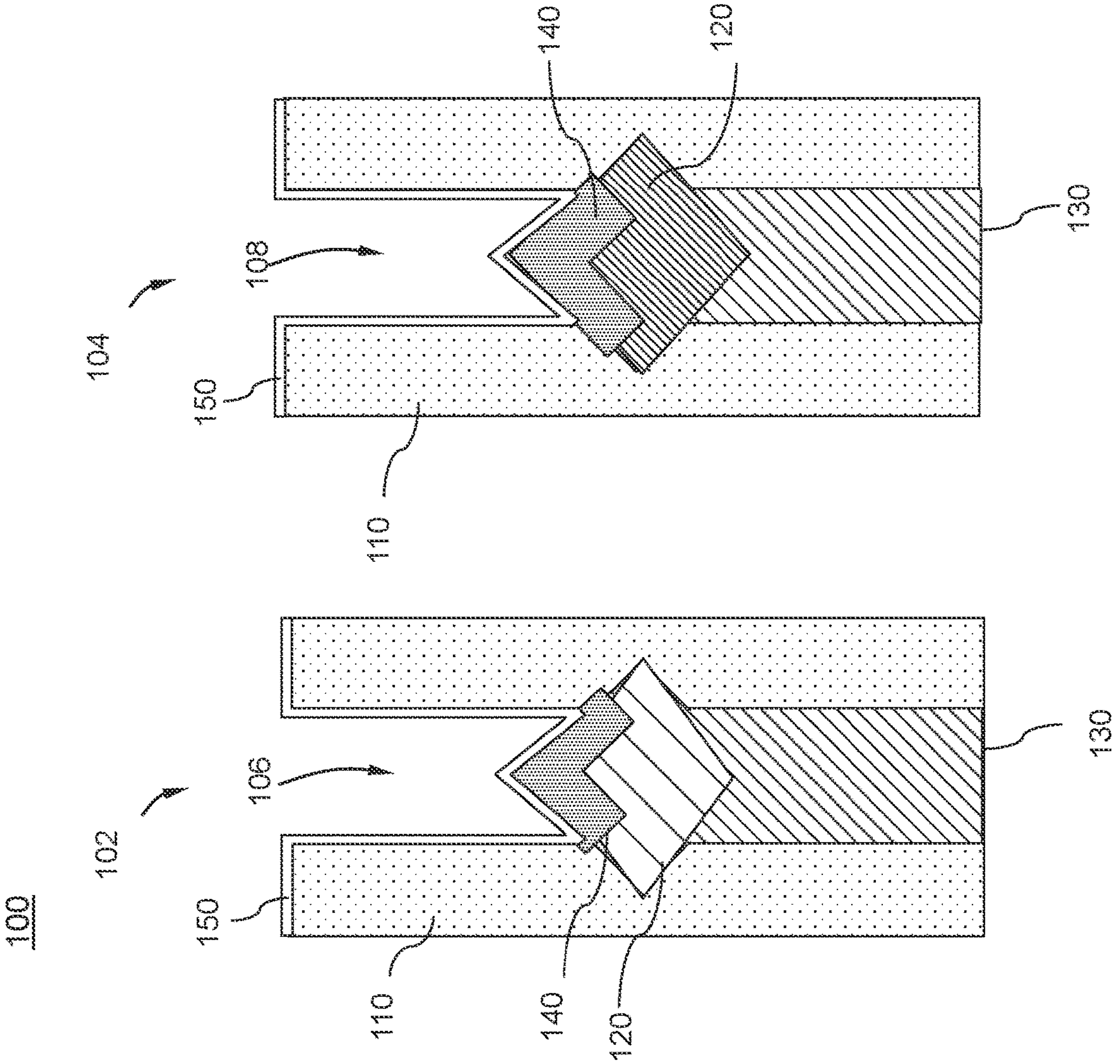
FIG. 1C illustrates a semiconductor structure in accordance with one or more embodiments of the disclosure.

With reference to FIG. 1C, an optional first barrier layer 150 is deposited on each of the n transistor 102 and the p transistor 104. In one or more embodiments, the optional first barrier layer 150 comprises a metal. In one or more embodiments, the optional first barrier layer 150 comprises a metal nitride. In one or more embodiments, the optional first barrier layer 150 comprises one or more of titanium nitride (TiN), tantalum nitride (TaN), tungsten nitride (WN), and molybdenum nitride (MoN). In one or more embodiments, the n transistor 102 having the optional first barrier layer 150 has a Schottky barrier height that is lower than an n transistor not having an optional first barrier layer.

Figure 1D:
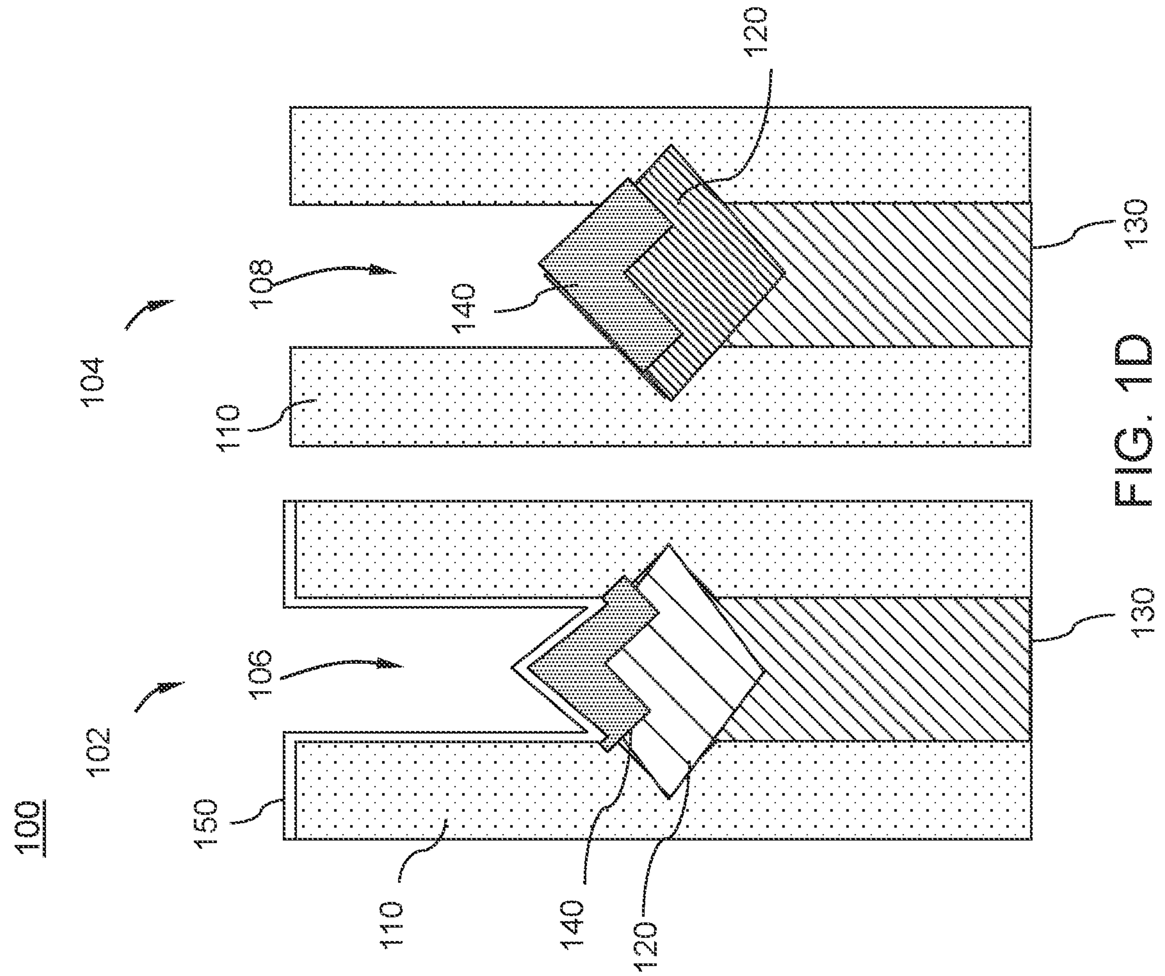
FIG. 1D illustrates a semiconductor structure in accordance with one or more embodiments of the disclosure.

With reference to FIG. 1D, when present, the first barrier layer 150 on the p transistor 104 is selectively removed from the p transistor 104 and not from the n transistor. The first barrier layer 150 may be removed by any suitable technique known to the skilled artisan. In one or more embodiments, the first barrier layer 150 is removed by one or more of etching, chemical mechanical polishing (CMP), planarization, and the like.

Figure 1E:
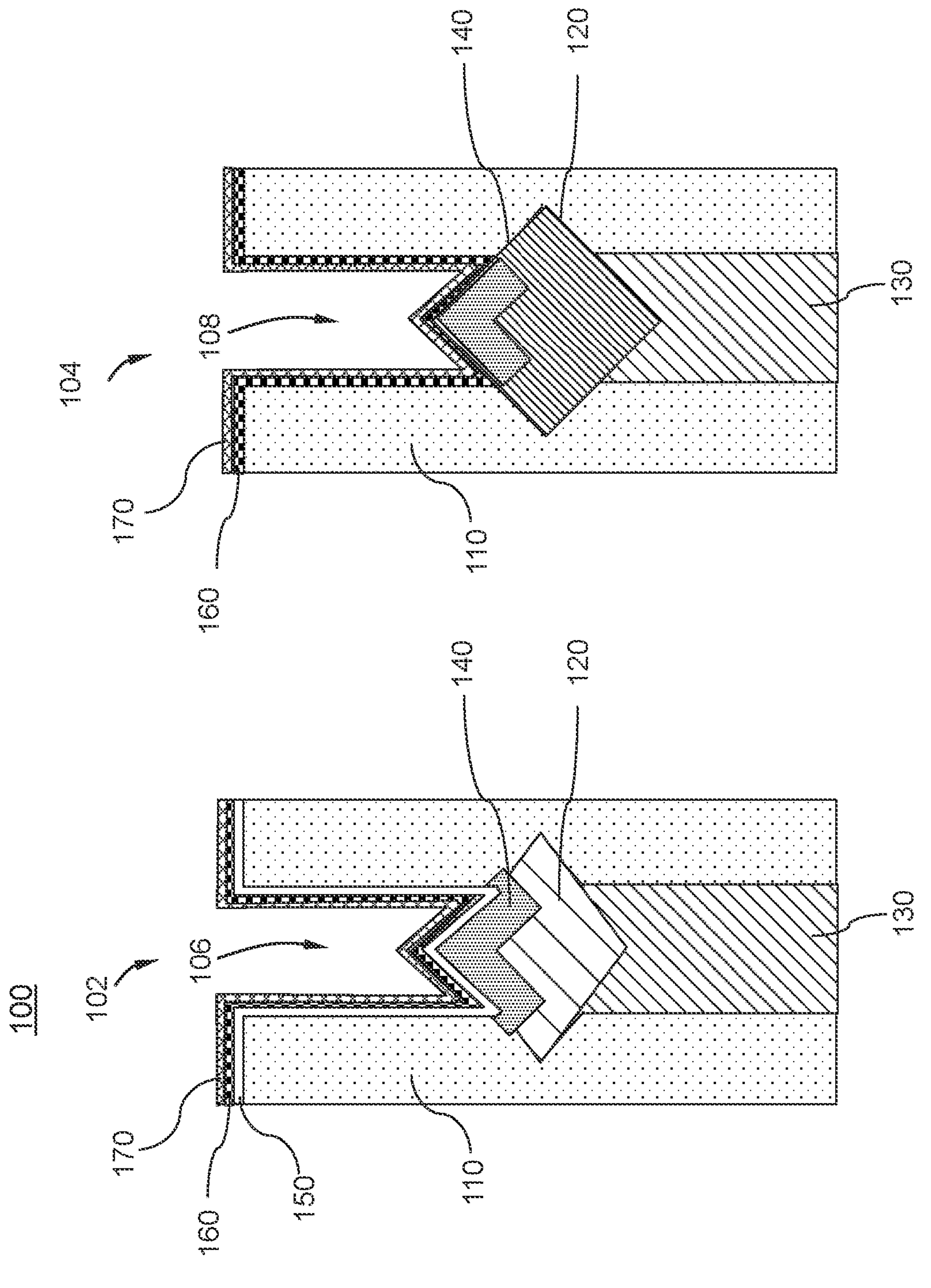
FIG. 1E illustrates a semiconductor structure in accordance with one or more embodiments of the disclosure.

Referring to FIG. 1E, a molybdenum silicide (MoSi) layer 160 is formed on the titanium silicide (TiSi) layer 140 on each of the n transistor 102 and the p transistor 104. In one or more embodiments, the molybdenum silicide (MoSi) layer 160 is formed on the optional first barrier layer 150 on the n transistor 102. The molybdenum silicide (MoSi) layer 160 may have any suitable thickness. In some embodiments, the molybdenum silicide (MoSi) layer 160 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the molybdenum silicide (MoSi) layer 160 has a thickness of about 40 Å.

The molybdenum silicide (MoSi) layer 160 may be formed according to any suitable process known to the skilled artisan. In one or more embodiments, the structure 100 is first cleaned to remove oxides from the surface. In some embodiments, the oxides are native oxide. In some embodiments, cleaning the surface forms a surface that is substantially free of oxide. As used in this manner, the term “substantially free of oxide” means that there are less than or equal to 5%, 2%, 1% or 0.5% of oxygen atoms on the surface. In one or more embodiments, anisotropic etching is used to remove oxide from the surface.

In one or more embodiments, to form the molybdenum silicide (MoSi) layer 160, a metal film is selectively formed on the titanium silicide (TiSi) layer 140. In some embodiments, the structure 100 is exposed to a metal precursor and a reactant. The metal film can be deposited by an ALD deposition process, a CVD deposition process, or combinations thereof. In some embodiments, the metal film comprises a molybdenum silicide (MoSi) film.

In one or more embodiments, the metal precursor comprises a molybdenum precursor. In some embodiments, the molybdenum precursor comprises a molybdenum halide. In some embodiments, the molybdenum halide comprises molybdenum fluoride, molybdenum chloride, or combinations thereof. In specific embodiments, the molybdenum precursor comprises molybdenum fluoride. In other specific embodiments, the molybdenum precursor comprises molybdenum chloride. In one or more embodiments, the precursor is flowed over the surface using a carrier gas. In some embodiments, the carrier gas is flowed through an ampoule comprising the precursor. In some embodiments, the carrier gas in an inert gas. In some embodiments, the inert gas comprises one or more of $N_2$, Ar, and He.

In one or more embodiments, the reactant comprises an oxidizing agent, a reducing agent, or combinations thereof. In some embodiments, the reactant comprises hydrogen ($H_2$), ammonia ($NH_3$), silane, polysilane, or combinations thereof. In some embodiments, the silane is selected from one or more of disilane, trisilane, tetrasilane, higher order silanes, and substituted silane. In specific embodiments, the reactant comprises a silane to form the molybdenum silicide (MoSi) layer 160. In one or more embodiments, the reactant is flowed over the surface using a carrier gas. In some embodiments, the carrier gas in an inert gas. In some embodiments, the inert gas comprises one or more of $N_2$, Ar, and He. In other embodiments, the reactant gas may be flowed continuously and the molybdenum precursor flow to the chamber is turned on and off.

Referring to FIG. 1E, a second barrier layer 170 is formed on each of the n transistor 102 and the p transistor 104. The second barrier layer 170 may comprise any suitable material known to the skilled artisan. In one or more embodiments, the second barrier layer 170 comprises a PVD metal film. In one or more embodiments, the second barrier layer 170 comprises nitridated molybdenum silicide (MoSiN). In one or more embodiments, the second barrier layer 170 comprises molybdenum nitride (MoN). In one or more embodiments, the second barrier layer 170 prevents formation of oxides on the molybdenum silicide (MoSi) layer 160. In one or more embodiments, the n transistor 102 having a second barrier layer 170 formed thereon has a Schottky barrier height that is lower than an n transistor not having a second barrier layer formed thereon. In one or more embodiments, the p transistor 104 having a second barrier layer 170 formed thereon has a Schottky barrier height that is lower than a p transistor not having a second barrier layer formed thereon.

The second barrier layer 170 may be formed by any process known to a person skilled in the art. In some embodiments, the second barrier layer 170 is formed on the molybdenum silicide (MoSi) layer 160. In some embodiments, the molybdenum silicide (MoSi) layer 160 is treated to form the second barrier layer 170. In some embodiments, the second barrier layer 170 is formed by nitridating the molybdenum silicide (MoSi) layer 160 or a portion thereof. In some embodiments, the second barrier layer 170 is formed by nitridating the molybdenum silicide (MoSi) layer 160 using ammonia ($NH_3$). In some embodiments, the second barrier layer 170 is formed by treating the molybdenum silicide (MoSi) layer 160 with plasma to nitridate the molybdenum silicide (MoSi) layer 160. In some embodiments, the plasma treatment comprises nitrogen ($N_2$) plasma treatment. In some embodiments, the second barrier layer 170 comprises a metal nitride, a PVD metal, or combinations thereof.

Figure 1F:
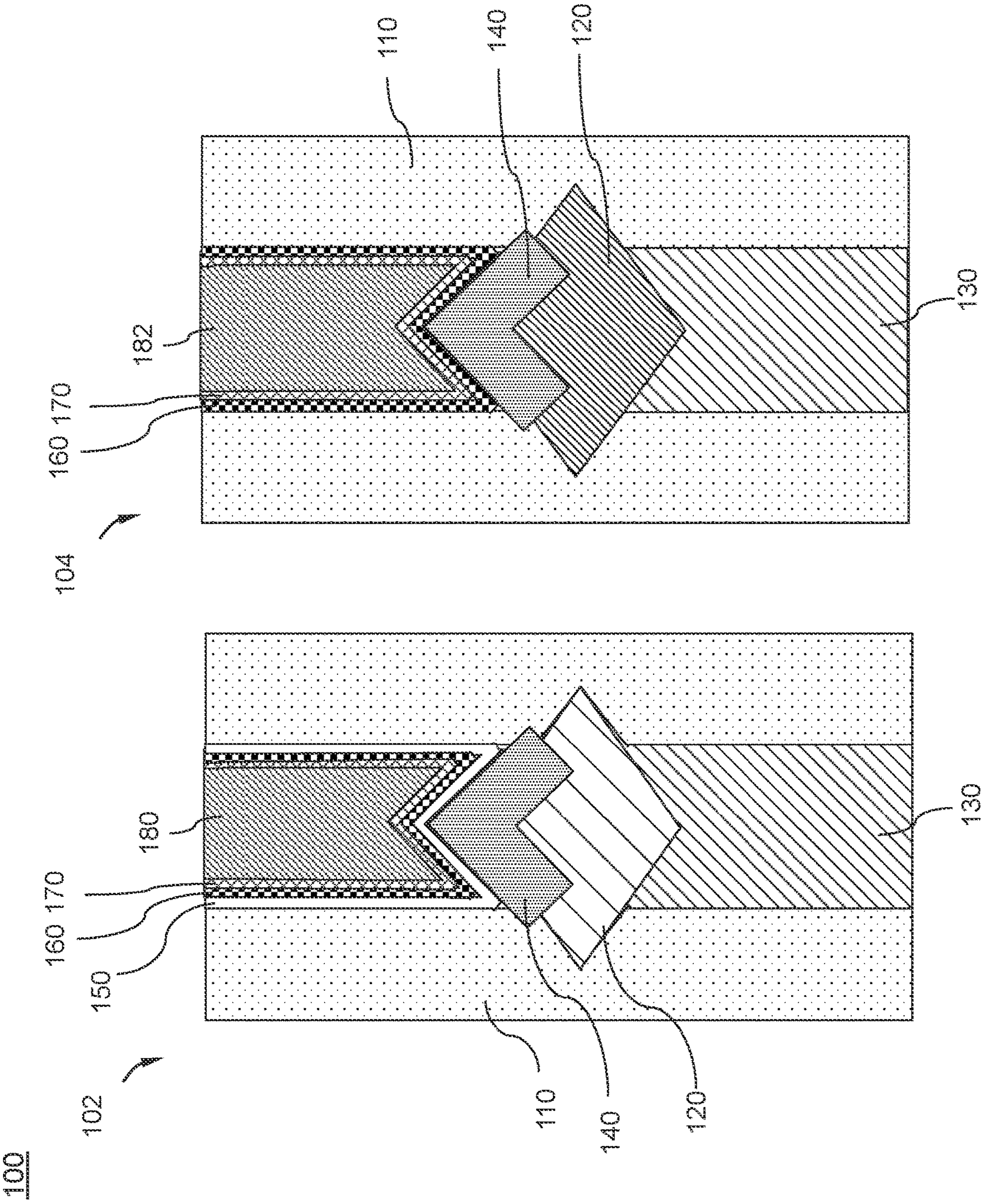
FIG. 1F illustrates a semiconductor structure in accordance with one or more embodiments of the disclosure.

With reference to FIG. 1F, the first opening 106 over the n transistor 102 and the second opening 108 over the p transistor 104 are independently filled with a gapfill material 180 and a gapfill material 182, respectively. In one or more embodiments, the gapfill material 180 is substantially free of voids or seams. The gapfill material 180 and the gapfill material 182 may independently comprise any suitable gapfill materials known to the skilled artisan. In one or more embodiments, the gapfill material 180 and the gapfill material 182 independently comprise one or more of tungsten (W), molybdenum (Mo), cobalt (Co) and ruthenium (Ru). In one or more embodiments, the gapfill material 180 in the first opening 106 over the n transistor 102 is the same as the gapfill material 182 in the second opening 108 over the p transistor 104. In one or more embodiments, the gapfill material 180 in the first opening 106 over the n transistor 102 is different than the gapfill material 182 in the second opening 108 over the p transistor 104.

The gap filling process may comprise any suitable gap filling process known to the skilled artisan. In one or more embodiments, the gap filling process comprises exposing the semiconductor structure 100 to a metal precursor and a reactant. In some embodiments, the metal precursor comprises one or more of a molybdenum precursor, a tungsten precursor, a cobalt precursor, and a ruthenium precursor.

In some embodiments, the gap filling process is a bottom-up gap filling process. In other embodiments, the gap filling process comprises a conformal gap filling process.

FIGS. 2A through 2G illustrate a semiconductor structure 200. The semiconductor structure 200 comprises an n transistor 202 and a p transistor 204. Each of the n transistor 202 and the p transistor 204 comprise a dielectric material 210, a source/drain material 220, and a substrate 230.

In one or more embodiments, the dielectric material 210 may comprise any suitable material known to the skilled artisan. In some embodiments, the dielectric material 210 comprises one or more of silicon, silicon oxide, silicon nitride, silicon carbide, and low-K dielectrics. In some embodiments, the dielectric material 210 comprises silicon oxide ($SiO_2$).

In some embodiments, the n transistor 202 and the p transistor 204 comprise source and drain contacts. In one or more embodiments, the source/drain material 220 may have more than one layer. In some embodiments, the source/drain material 220 comprises a layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In one or more embodiments, the source/drain material 220 of the n transistor 202 comprises silicon (Si) doped with phosphorous (P). In one or more embodiments, the source/drain material 220 of the n transistor 202 has a bandgap in a range of about 1.0 eV to about 1.2 eV.

In one or more embodiments, the source/drain material 220 of the p transistor 204 comprises silicon germanium (SiGe) doped with boron (B). In one or more embodiments, the source/drain material 220 of the p transistor 204 has a bandgap in a range of about 0.5 eV to about 1.0 eV.

Figure 2A:
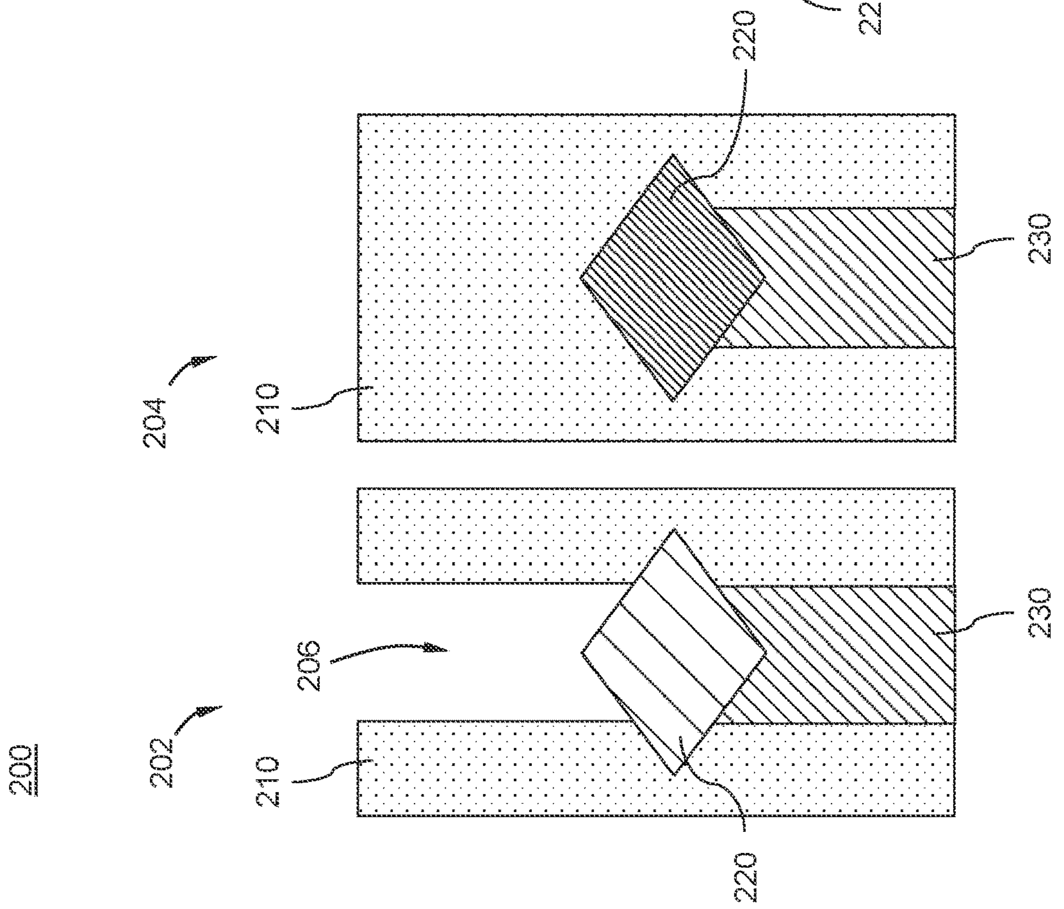
FIG. 2A illustrates a semiconductor structure in accordance with one or more embodiments of the disclosure.
Figure 2B:
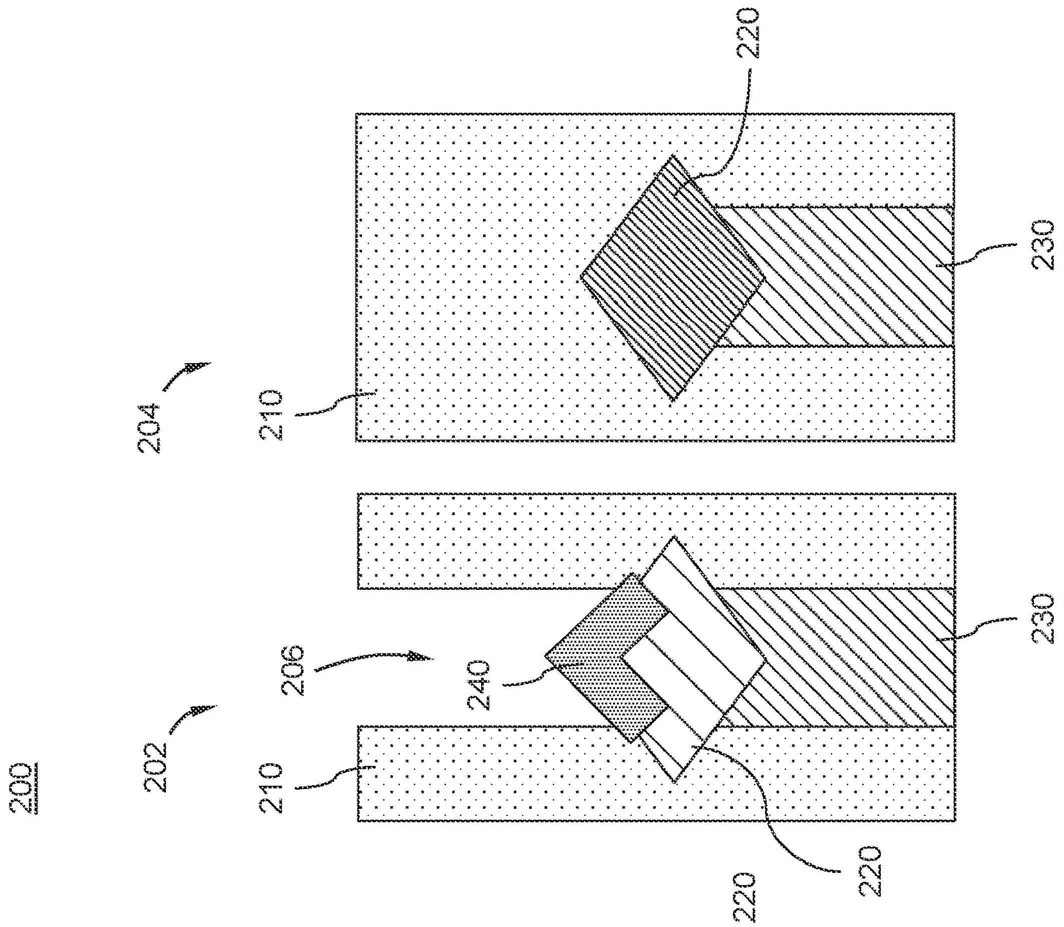
FIG. 2B illustrates a semiconductor structure in accordance with one or more embodiments of the disclosure.

Referring to FIGS. 2A-2B, there is a first opening 206 over the n transistor 202, and there is a second opening 208 over the p transistor 204. The first opening 206 and the second opening 208 can have any suitable aspect ratio (ratio of the depth of the opening to the width of the opening). In one or more embodiments, the first opening 206 and the second opening 208 may independently have an aspect ratio in a range of from 3:1 to 15:1, from 6:1 to 15:1, from 9:1 to 15:1, from 12:1 to 15:1, or an aspect ratio greater than 10:1.

With reference to FIG. 2B, a titanium silicide (TiSi) layer 240 is deposited on the n transistor 202. The titanium silicide (TiSi) layer 240 may have any suitable thickness. In some embodiments, the titanium silicide (TiSi) layer 240 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the titanium silicide (TiSi) layer 240 has a thickness of about 40 Å.

Figure 2D:
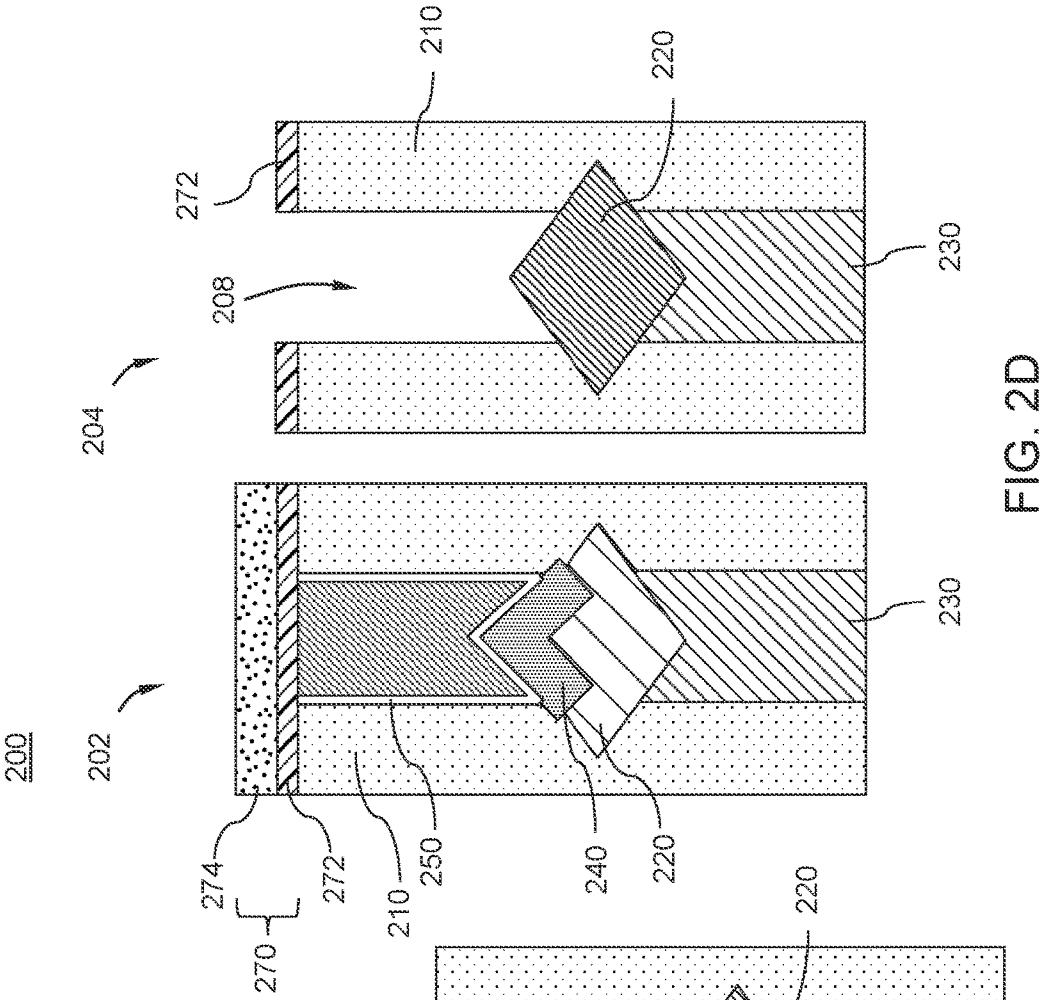
FIG. 2D illustrates a semiconductor structure in accordance with one or more embodiments of the disclosure.
Figure 2C:
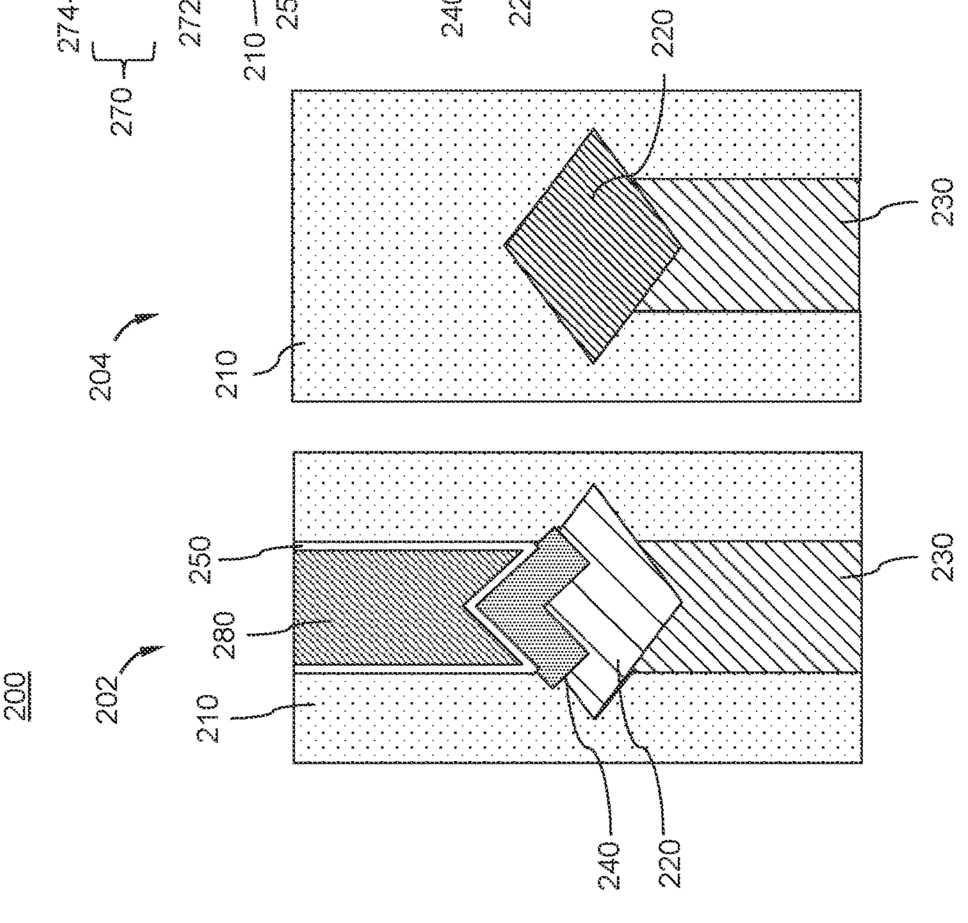
FIG. 2C illustrates a semiconductor structure in accordance with one or more embodiments of the disclosure.

With reference to FIG. 2C, an optional barrier layer 250 is formed on the titanium silicide (TiSi) layer 240 on the n transistor 202. In one or more embodiments, the optional first barrier layer 250 comprises a metal. In one or more embodiments, the optional first barrier layer 250 comprises a metal nitride. In one or more embodiments, the optional first barrier layer 250 comprises one or more of titanium nitride (TiN), tantalum nitride (TaN), tungsten nitride (WN), and molybdenum nitride (MoN).

In one or more embodiments, the first opening 206 over the n transistor 202 is filled with a first gapfill material 280. In one or more embodiments, the first gapfill material 280 is substantially free of voids or seams. In one or more embodiments, the first gapfill material 280 comprises one or more of tungsten (W), molybdenum (Mo), cobalt (Co) and ruthenium (Ru).

The gap filling process may comprise any suitable gap filling process known to the skilled artisan. In one or more embodiments, the gap filling process comprises exposing the semiconductor structure 200 to a metal precursor and a reactant. In some embodiments, the metal precursor comprises one or more of a molybdenum precursor, a tungsten precursor, a cobalt precursor, and a ruthenium precursor.

Referring to FIG. 2D, a mask layer 270 is formed on a top surface of the n transistor 202 and the p transistor 204. In one or more embodiments, the mask layer 270 comprises one or more of a hard mask layer 272 and a photoresist layer 274. The hard mask layer 272 may comprise any suitable material known to the skilled artisan. In one or more embodiments, the hard mask layer 272 comprises silicon dioxide ($SiO_2$). The photoresist layer 274 may comprise any suitable material known to the skilled artisan. As recognized by one of skill in the art, while the photoresist layer 274 is illustrated as absent from the p transistor, this is merely for ease of drawing. One skilled in the art understands that the hard mask layer 272 and the photoresist layer 274 form on a top surface of both the n transistor 202 and the p transistor 204. Processing to form a second opening 208 removes the photoresist layer 274. In one or more embodiments, the second opening 208 is formed over the p transistor 204. The second opening 208 may be formed by any suitable process known to the skilled artisan. In one or more embodiments, the second opening 208 is formed by etching.

The second opening 208 can have any suitable aspect ratio. In one or more embodiments, the second opening may have an aspect ratio in a range of from 3:1 to 15:1, from 6:1 to 15:1, from 9:1 to 15:1, from 12:1 to 15:1, or an aspect ratio greater than 10:1.

Figure 2F:
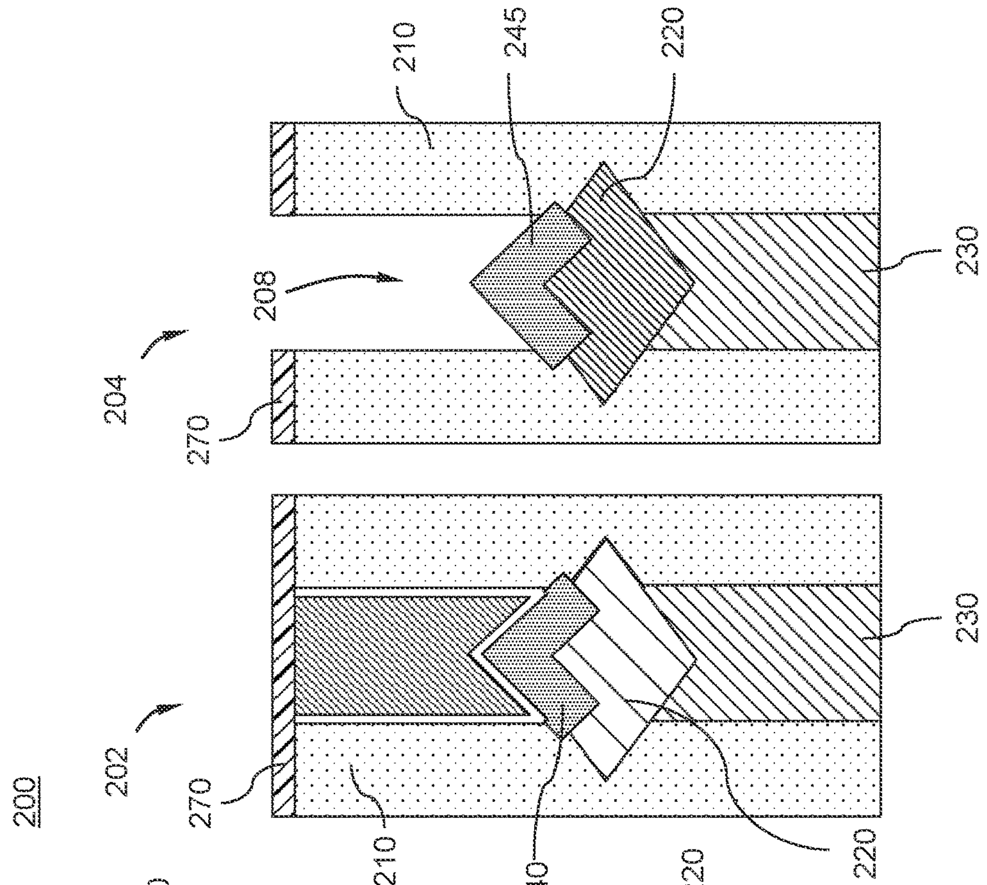
FIG. 2F illustrates a semiconductor structure in accordance with one or more embodiments of the disclosure.
Figure 2E:
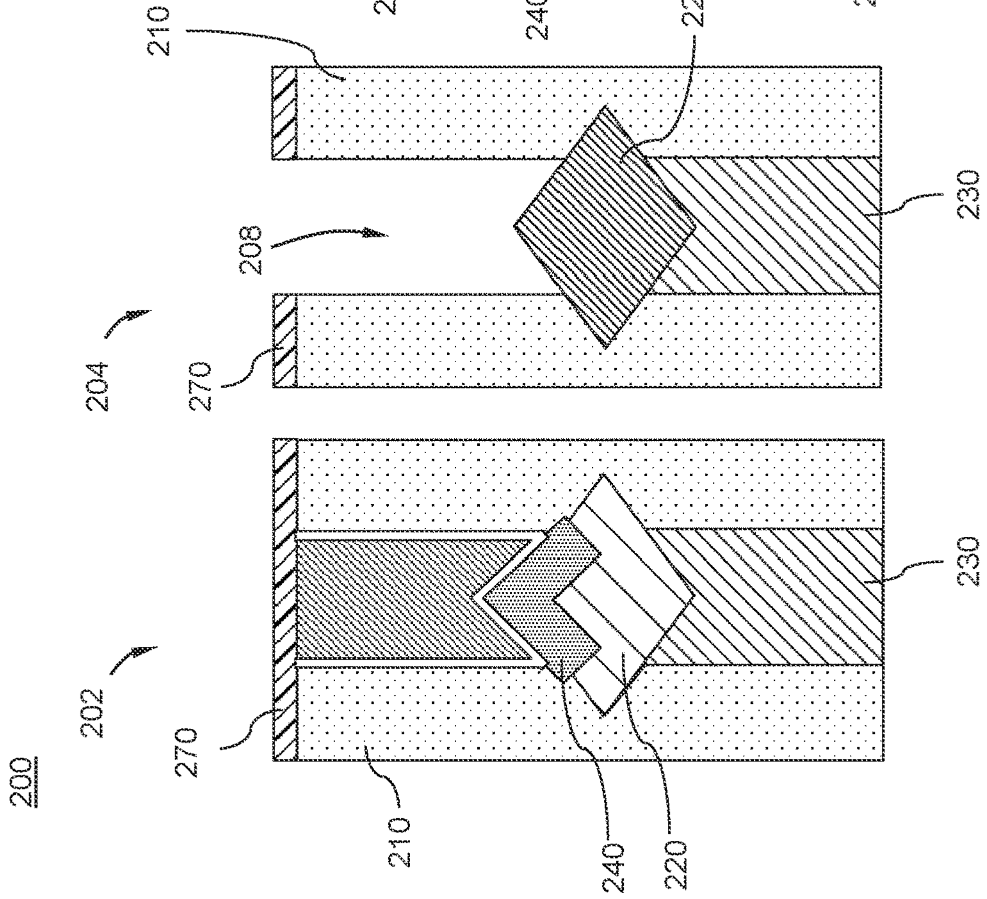
FIG. 2E illustrates a semiconductor structure in accordance with one or more embodiments of the disclosure.

Referring to FIG. 2E, the photoresist layer 280 is removed from the mask layer 270 of the n transistor 202. The photoresist layer 280 may be removed by any suitable means known to the skilled artisan. In one or more embodiments, the photoresist layer 280 is removed by stripping.

With reference to FIG. 2F, a molybdenum silicide (MoSi) layer 245 is selectively formed on the source/drain material 220 of the p transistor 204. The molybdenum silicide (MoSi) layer 245 may be formed by any suitable process known to the skilled artisan. The molybdenum silicide (MoSi) layer 245 may have any suitable thickness. In some embodiments, the molybdenum silicide (MoSi) layer 245 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the molybdenum silicide (MoSi) layer 245 has a thickness of about 40 Å.

The molybdenum silicide (MoSi) layer 245 may be formed according to any suitable process known to the skilled artisan. In one or more embodiments, the structure 200 is first cleaned to remove oxides from the surface. In some embodiments, the oxides are native oxide. In some embodiments, cleaning the surface forms a surface that is substantially free of oxide. As used in this manner, the term "substantially free of oxide" means that there are less than or equal to 5%, 2%, 1% or 0.5% of oxygen atoms on the surface. In one or more embodiments, anisotropic etching is used to remove oxide from the surface.

In one or more embodiments, to form the molybdenum silicide (MoSi) layer 245, a metal film is selectively formed on the source/drain material 220. In some embodiments, the semiconductor structure 200 is exposed to a metal precursor and a reactant. The metal film can be deposited by an ALD deposition process, a CVD deposition process, or combinations thereof. In some embodiments, the metal film comprises a molybdenum silicide film.

In one or more embodiments, the metal precursor comprises a molybdenum precursor. In some embodiments, the molybdenum precursor comprises a molybdenum halide. In some embodiments, the molybdenum halide comprises molybdenum fluoride, molybdenum chloride, or combinations thereof. In specific embodiments, the molybdenum precursor comprises molybdenum fluoride. In other specific embodiments, the molybdenum precursor comprises molybdenum chloride. In one or more embodiments, the precursor is flowed over the surface using a carrier gas. In some embodiments, the carrier gas is flowed through an ampoule comprising the precursor. In some embodiments, the carrier gas in an inert gas. In some embodiments, the inert gas comprises one or more of $N_2$, Ar, and He.

In one or more embodiments, the reactant comprises an oxidizing agent, a reducing agent, or combinations thereof. In some embodiments, the reactant comprises hydrogen ($H_2$), ammonia ($NH_3$), silane, polysilane, or combinations thereof. In some embodiments, the silane is selected from one or more of disilane, trisilane, tetrasilane, higher order silanes, and substituted silane. In specific embodiments, the reactant comprises a silane to form the molybdenum silicide (MoSi) layer 245. In one or more embodiments, the reactant is flowed over the surface using a carrier gas. In some embodiments, the carrier gas in an inert gas. In some embodiments, the inert gas comprises one or more of $N_2$, Ar, and He. In other embodiments, the reactant gas may be flowed continuously and the molybdenum precursor flow to the chamber is turned on and off.

Figure 2G:
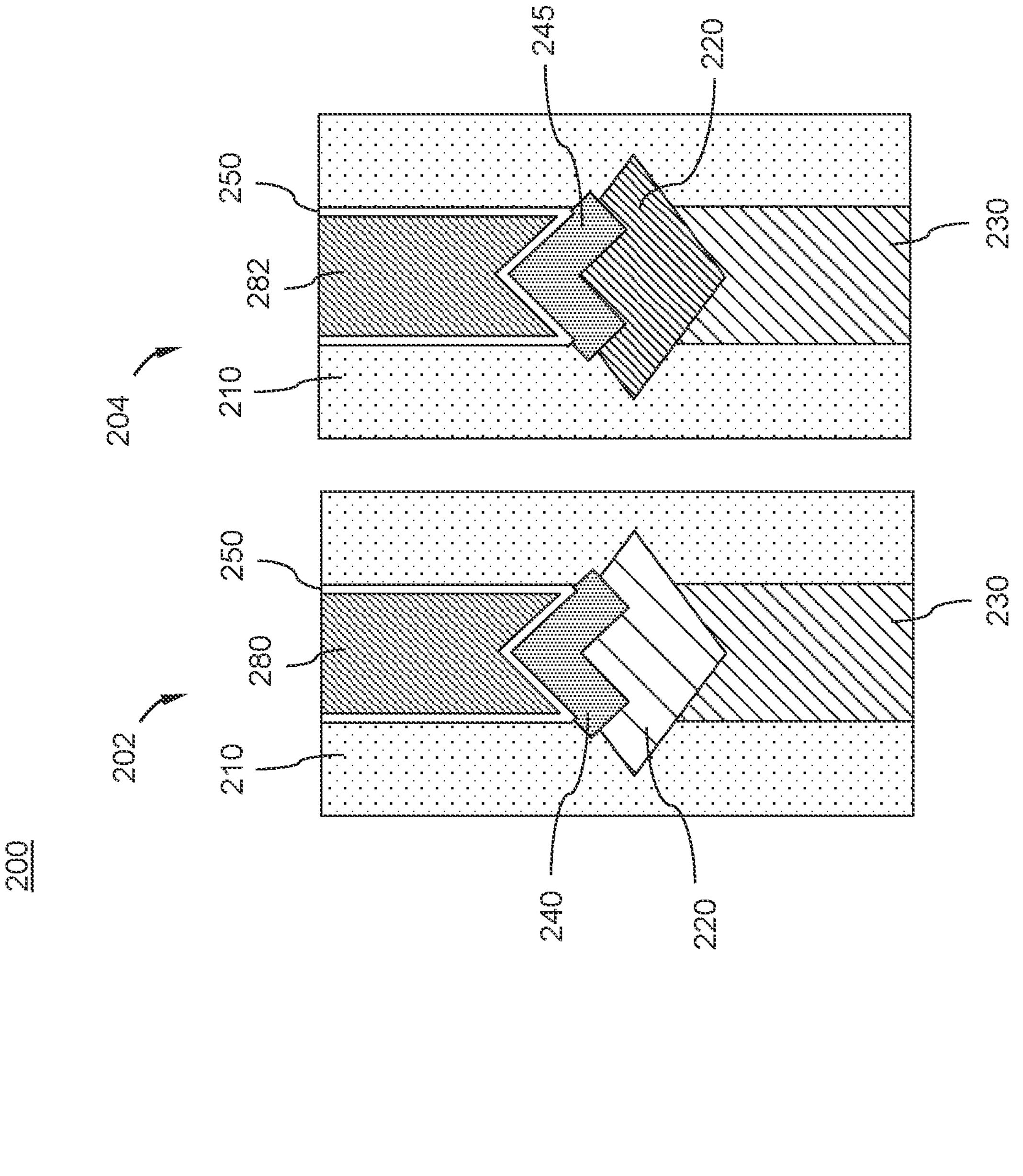
FIG. 2G illustrates a semiconductor structure in accordance with one or more embodiments of the disclosure.

Referring to FIG. 2G, the mask layer 270 formed on each of the top surface of the n transistor 202 and the p transistor 204 is removed. The mask layer 270 may be removed by any suitable means known to the skilled artisan. In some embodiments, the mask layer 270 is removed by etching or planarization.

In one or more embodiments, the second opening 208 over the p transistor 204 is filled with a second gapfill material 282. In one or more embodiments, the second gapfill material 282 is substantially free of voids or seams. The first gapfill material 280 and the second gapfill material 282 may independently comprise any suitable gapfill materials known to the skilled artisan. In one or more embodiments, the second gapfill material 282 comprises one or more of tungsten (W), molybdenum (Mo), cobalt (Co) and ruthenium (Ru). In one or more embodiments, the gapfill material 280 over the n transistor 202 is the same as the gapfill material 282 over the p transistor 204. In one or more embodiments, the gapfill material 280 is different than the gapfill material 282.

The gap filling process may comprise any suitable gap filling process known to the skilled artisan. In one or more embodiments, the gap filling process comprises exposing the semiconductor structure 200 to a metal precursor and a reactant. In some embodiments, the metal precursor comprises one or more of a molybdenum precursor, a tungsten precursor, a cobalt precursor, and a ruthenium precursor.

In some embodiments, the gap filling process is a bottom-up gap filling process. In other embodiments, the gap filling process comprises a conformal gap filling process.

Figure 3:
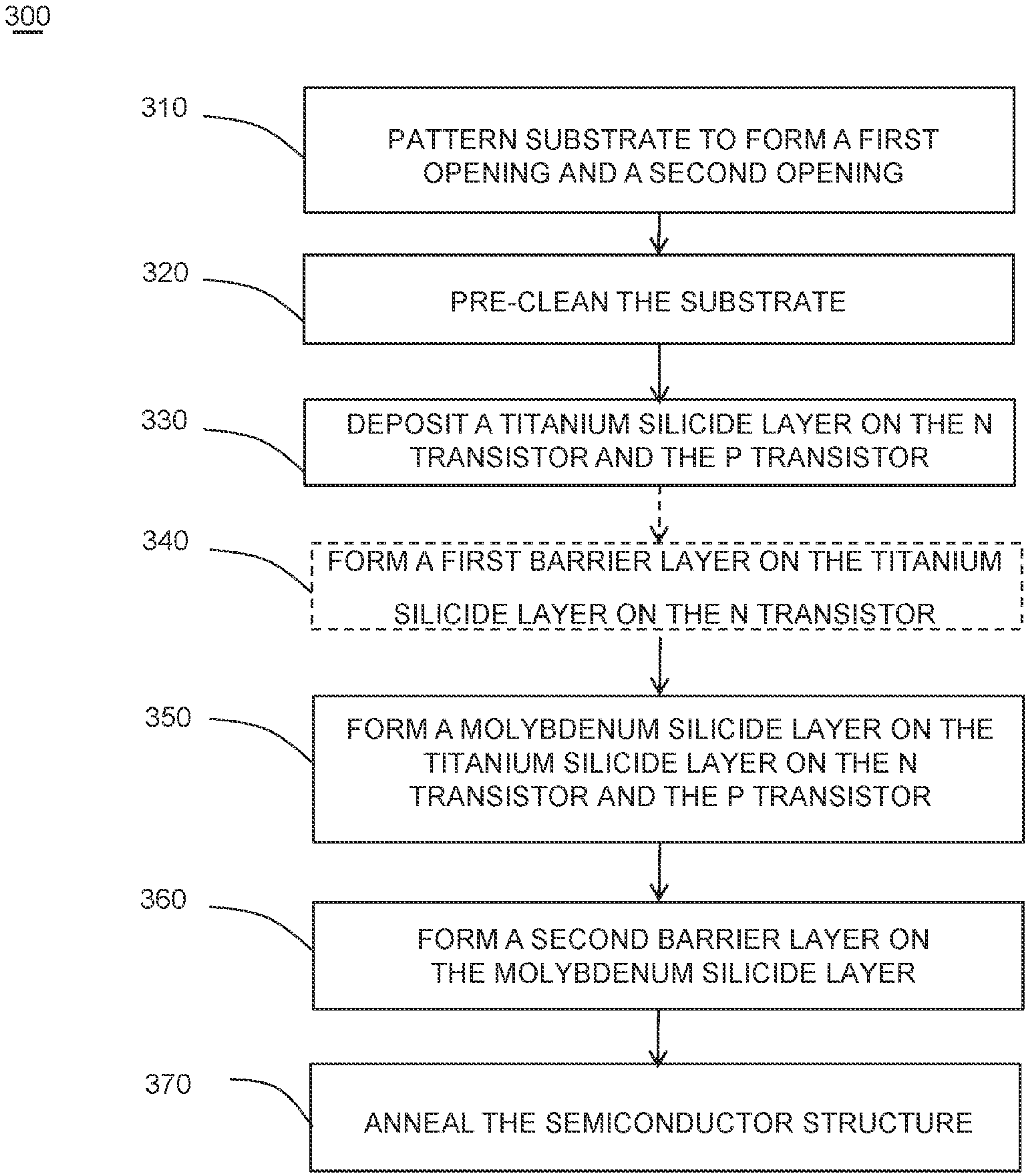
FIG. 3 illustrates a process flow diagram of a method in accordance with one or more embodiments of the disclosure.

FIG. 3 illustrates a process flow diagram of a method 300 of forming a semiconductor structure. FIG. 3 illustrates a method of forming any of the semiconductor structures of one or more embodiments shown in FIGS. 1A-1F and 2A-2G.

In one or more embodiments, the method 300 of forming a semiconductor structure comprises, at operation 310, patterning a substrate to form a first opening and a second opening, the substrate comprising an n transistor and a p transistor, the first opening over the n transistor and the second opening over the p transistor. At operation 320, the method 300 comprises pre-cleaning the substrate. At operation 330, the method 300 comprises depositing a titanium silicide (TiSi) layer on the n transistor and on the p transistor by plasma-enhanced chemical vapor deposition (PECVD). At operation 340, the method 300 optionally includes depositing a first barrier layer on the titanium silicide (TiSi) layer and selectively removing the first barrier layer from the p transistor. At operation 350, the method 300 comprises selectively forming a molybdenum silicide (MoSi) layer on the titanium silicide (TiSi) layer on the n transistor and the p transistor. At operation 360, the method 300 comprises forming a second barrier layer on the molybdenum silicide (MoSi) layer. At operation 370, the method 300 comprises annealing the semiconductor structure.

At operation 310, the method 300 comprises patterning a substrate to form at least one of a first opening and a second opening. In one or more embodiments, patterning the substrate comprises using one or more patterning techniques known to one of ordinary skill in the art of microelectronic device manufacturing.

At operation 320, the method 300 comprises pre-cleaning the substrate. In one or more embodiments, keeping the pre-cleaning process under vacuum ensures that no oxide is introduced/formed on the substrate surface during the method 300. In some embodiments, pre-cleaning the substrate (or surface of the substrate) removes oxides from the surface. In some embodiments, the oxides are native oxides. In some embodiments, cleaning the surface forms a surface that is substantially free of oxides. As used in this manner, the term "substantially free of oxides" means that there are less than or equal to 5%, 2%, 1% or 0.5% of oxygen atoms on the surface. In one or more embodiments, anisotropic etching is used to remove oxide from the surface. In one or more embodiments, anisotropic etching removes oxide more from the surface of the source/drain material than the dielectric material. In one or more embodiments, pre-cleaning the surface forms a source/drain material that is substantially free of oxide.

At operation 330, the method 300 comprises depositing a titanium silicide (TiSi) layer on the n transistor and the p transistor by plasma-enhanced chemical vapor deposition (PECVD). In one or more embodiments, after depositing the titanium silicide (TiSi) layer on the n transistor and the p transistor, a rapid thermal process (RTP) is performed. In one or more embodiments, the rapid thermal process (RTP) comprises heating the titanium silicide (TiSi) layer to a temperature in a range of about 500° C. to about 700° C. In one or more embodiments, the rapid thermal process (RTP) is performed for about 1 minute. In one or more embodiments, the rapid thermal process (RTP) removes unreacted metal from the titanium silicide (TiSi) layer.

At operation 340, the method 300 optionally includes depositing a first barrier layer on the titanium silicide (TiSi) layer on the n transistor and selectively removing the first barrier layer from the p transistor. In one or more embodiments, selectively removing the first barrier layer from the p transistor allows the molybdenum silicide (MoSi) layer on the p transistor to form an ohmic contact with the titanium silicide (TiSi) layer on the p transistor.

In some embodiments, the titanium silicide (TiSi) layer on the n transistor and on the p transistor is protected from oxide formation by the first barrier layer. The first barrier layer may be formed by any process known to a person skilled in the art. In one or more embodiments, at operation 340, the first barrier layer is formed by an atomic layer deposition (ALD) process. In one or more embodiments, at operation 340, the first barrier layer is formed by a physical vapor deposition (PVD) process.

In some embodiments, the first barrier layer is formed on the titanium silicide (TiSi) layer. In some embodiments, the titanium silicide (TiSi) layer is treated to form the first barrier layer. In some embodiments, the first barrier layer is formed by nitridating the titanium silicide (TiSi) layer. In some embodiments, the first barrier layer is formed by nitridating the titanium silicide (TiSi) layer using ammonia ($NH_3$). In some embodiments, the first barrier layer is formed by treating the titanium silicide (TiSi) layer with plasma to nitridate the titanium silicide (TiSi) layer. In some embodiments, the plasma treatment comprises nitrogen ($N_2$) plasma treatment.

In one or more embodiments, forming the first barrier layer by nitridating the titanium silicide (TiSi) layer forms a titanium silicon nitride (TiSiN) layer. In one or more embodiments, a semiconductor structure having the titanium silicon nitride (TiSiN) layer has a reduced Schottky barrier height than a semiconductor structure not having a titanium silicon nitride (TiSiN) layer. In one or more embodiments, a semiconductor structure having a titanium silicon nitride (TiSiN) layer has a Schottky barrier height in a range of from about 0.50 eV to about 0.55 eV. In one or more embodiments, a semiconductor structure not having a titanium silicon nitride (TiSiN) layer has a Schottky barrier height in a range of from about 0.6 eV to about 0.7 eV.

In some embodiments, at operation 350, the method 300 comprises selectively forming a molybdenum silicide (MoSi) layer on the titanium silicide (TiSi) layer on the n transistor and the p transistor. In one or more embodiments, the molybdenum silicide (MoSi) layer is formed on the silicon germanium (SiGe) doped with boron (B) substrate of the p transistor. In one or more embodiments, after selectively forming the molybdenum silicide (MoSi) layer on the p transistor, a rapid thermal process (RTP) is performed. In one or more embodiments, the rapid thermal process (RTP) comprises heating the molybdenum silicide (MoSi) layer to a temperature in a range of about 500° C. to about 700° C. In one or more embodiments, the rapid thermal process (RTP) is performed for about 1 minute. In one or more embodiments, the rapid thermal process (RTP) removes unreacted metal from the molybdenum silicide (MoSi) layer.

In another aspect of the disclosure, a method 300 of forming the semiconductor structure includes reducing the contact resistance of the semiconductor structure. In some embodiments, at operation 370, annealing the semiconductor structure reduces the contact resistance. In one or more embodiments, annealing the semiconductor structure produces a smooth surface. In one or more embodiments, at operation 370, annealing the semiconductor structure forms one or more of ohmic and pseudo-ohmic contacts on the n transistor and on the p transistor.

The semiconductor structure can be annealed by any process known to a person skilled in the art. In some embodiments, the semiconductor structure is annealed by a rapid thermal process (RTP). In one or more embodiments, the rapid thermal process (RTP) comprises annealing the semiconductor structure to a temperature in a range of about 500° C. to about 700° C. In one or more embodiments, the rapid thermal process (RTP) comprises annealing the semiconductor structure to a temperature of about 600° C.

In some embodiments, the annealed semiconductor structure has a root mean square (RMS) roughness in a range of from 4% to less than 30%, from 4% to less than 20%, from 4% to less than 10%, from 10% to less than 30%, from 10% to less than 20% or from 20% to less than 30%.

In some embodiments, the method 300 comprises performing a gap filling process. In one or more embodiments, the gap filling process comprises independently filling the first opening over the n transistor and the second opening over the p transistor. In some embodiments, the gap filling process is a bottom-up gap filling process. In other embodiments, the gap filling process comprises a conformal gap filling process. In one or more embodiments, the method 300 comprises filling the first opening over the n transistor with a first gapfill material and filling the second opening over the p transistor with a second gapfill material. In one or more embodiments, each of the first gapfill material and the second gapfill material are substantially free of voids or seams. In one or more embodiments, each of the first gapfill material and the second gapfill material comprise one or more of tungsten (W), molybdenum (Mo), cobalt (Co) and ruthenium (Ru).

In one or more embodiments, the method 300 includes an optional post-processing operation.

Figure 4:
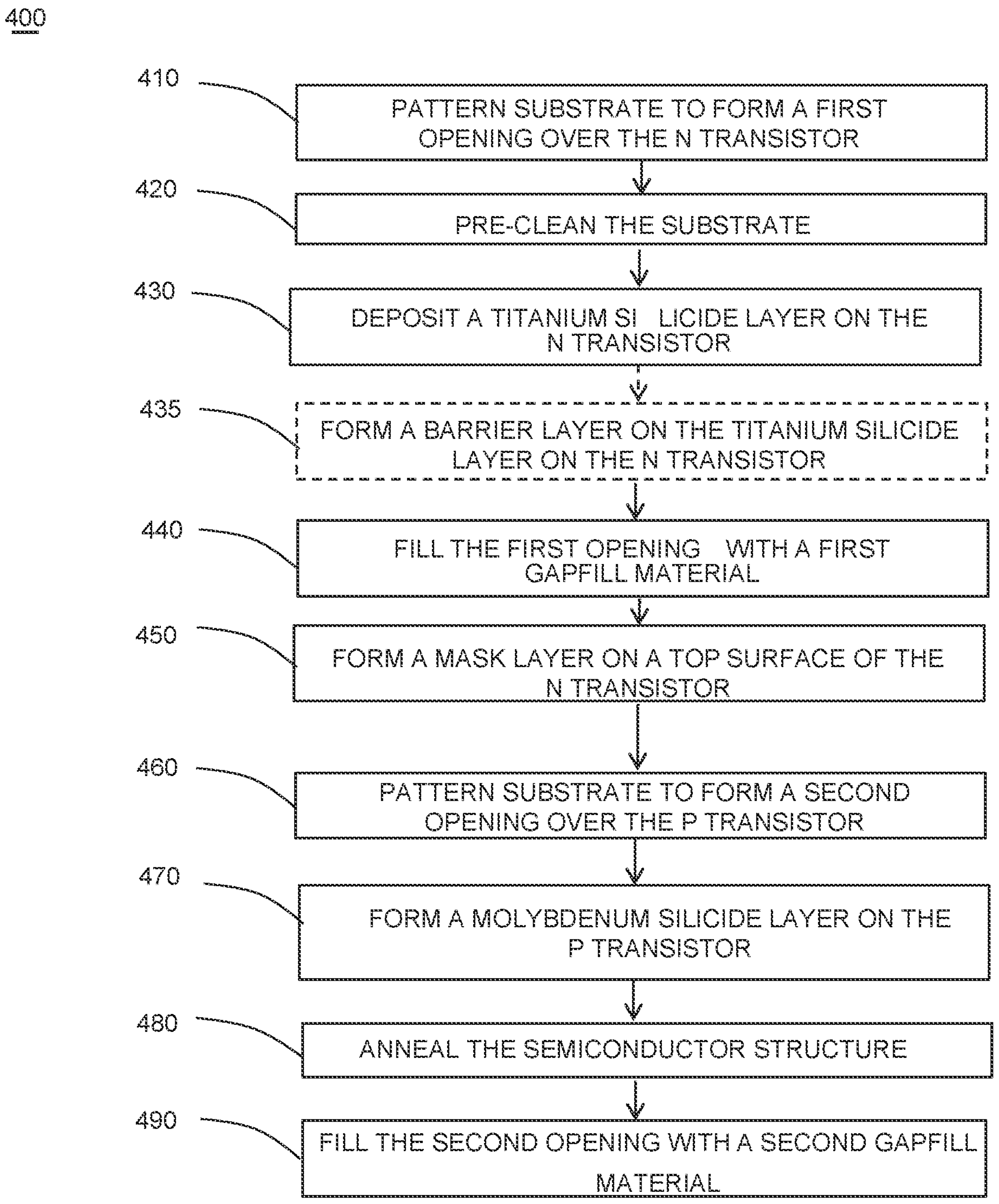
FIG. 4 illustrates a process flow diagram of a method in accordance with one or more embodiments of the disclosure.

FIG. 4 illustrates a process flow diagram of a method 400 of forming a semiconductor structure. FIG. 4 illustrates a method of forming any of the semiconductor structures of one or more embodiments shown in FIGS. 1A-1F and 2A-2G.

In some embodiments, a method 400 of forming a semiconductor structure comprises, at operation 410, patterning a substrate to form a first opening, the substrate comprising an n transistor and a p transistor, the first opening over the n transistor. At operation 420, the method 400 comprises pre-cleaning the substrate. At operation 430, the method 400 comprises depositing a titanium silicide (TiSi) layer on the n transistor by plasma-enhanced chemical vapor deposition (PECVD). At operation 430, the method 400 optionally includes forming a barrier layer on the titanium silicide (TiSi) layer on the n transistor. At operation 440, the method 400 comprises filling the first opening with a first gapfill material. At operation 450, the method 400 comprises forming a mask layer on a top surface of the n transistor. At operation 460, the method 400 comprises patterning the substrate to form a second opening over the p transistor. In one or more embodiment, the method 400 optionally includes depositing a first barrier layer on the titanium silicide (TiSi) layer and selectively removing the first barrier layer from the p transistor. At operation 470, the method 400 comprises selectively forming a molybdenum silicide (MoSi) layer on the p transistor. At operation 480, the method 400 comprises annealing the semiconductor structure. At operation 490, the method 400 comprises filling the second opening with a second gapfill material.

At operation 410, the method 400 comprises patterning a substrate to form at a first opening over the n transistor. In one or more embodiments, patterning the substrate comprises using one or more patterning techniques known to one of ordinary skill in the art of microelectronic device manufacturing.

At operation 420, the method 400 comprises pre-cleaning the substrate. In one or more embodiments, keeping the pre-cleaning process under vacuum ensures that no oxide is introduced/formed on the substrate surface during the method 400. In some embodiments, pre-cleaning the substrate (or surface of the substrate) removes oxides from the surface. In some embodiments, the oxides are native oxides. In some embodiments, cleaning the surface forms a surface that is substantially free of oxides. As used in this manner, the term "substantially free of oxides" means that there are less than or equal to 5%, 2%, 1% or 0.5% of oxygen atoms on the surface. In one or more embodiments, anisotropic etching is used to remove oxide from the surface. In one or more embodiments, anisotropic etching removes oxide more from the surface of the source/drain material than the dielectric material. In one or more embodiments, pre-cleaning the surface forms a source/drain material that is substantially free of oxide.

At operation 430, the method 400 comprises depositing a titanium silicide (TiSi) layer on the n transistor by plasma-enhanced chemical vapor deposition (PECVD). In one or more embodiments, after depositing the titanium silicide (TiSi) layer on the n transistor, a rapid thermal process (RTP) is performed. In one or more embodiments, the rapid thermal process (RTP) comprises heating the titanium silicide (TiSi) layer to a temperature in a range of about 500° C. to about 700° C. In one or more embodiments, the rapid thermal process (RTP) is performed for about 1 minute. In one or more embodiments, the rapid thermal process (RTP) removes unreacted metal from the titanium silicide (TiSi) layer.

At operation 435, the method 400 optionally includes depositing a first barrier layer on the titanium silicide (TiSi) layer on the n transistor. In some embodiments, the titanium silicide (TiSi) layer on the n transistor and is protected from oxide formation by the first barrier layer. The first barrier layer may be formed by any process known to a person skilled in the art. In one or more embodiments, at operation 435, the first barrier layer is formed by an atomic layer deposition (ALD) process. In one or more embodiments, at operation 435, the first barrier layer is formed by a physical vapor deposition (PVD) process.

In some embodiments, the first barrier layer is formed on the titanium silicide (TiSi) layer. In some embodiments, the titanium silicide (TiSi) layer is treated to form the first barrier layer. In some embodiments, the first barrier layer is formed by nitridating the titanium silicide (TiSi) layer. In some embodiments, the first barrier layer is formed by nitridating the titanium silicide (TiSi) layer using ammonia ($NH_3$). In some embodiments, the first barrier layer is formed by treating the titanium silicide (TiSi) layer with plasma to nitridate the titanium silicide (TiSi) layer. In some embodiments, the plasma treatment comprises nitrogen ($N_2$) plasma treatment.

In one or more embodiments, forming the first barrier layer by nitridating the titanium silicide (TiSi) layer forms a titanium silicon nitride (TiSiN) layer. In one or more embodiments, a semiconductor structure having the titanium silicon nitride (TiSiN) layer has a reduced Schottky barrier height than a semiconductor structure not having a titanium silicon nitride (TiSiN) layer. In one or more embodiments, a semiconductor structure having a titanium silicon nitride (TiSiN) layer has a Schottky barrier height in a range of from about 0.50 eV to about 0.55 eV. In one or more embodiments, a semiconductor structure not having a titanium silicon nitride (TiSiN) layer has a Schottky barrier height in a range of from about 0.6 eV to about 0.7 eV.

At operation 440, the method 400 comprises filling the first opening with a first gapfill material. In some embodiments, filling the first opening comprises a bottom-up gap filling process. In other embodiments, filling the first opening comprises a conformal gap filling process. In one or more embodiments, the first gapfill material is substantially free of voids or seams. In one or more embodiments, the first gapfill material comprises one or more of tungsten (W), molybdenum (Mo), cobalt (Co) and ruthenium (Ru).

In some embodiments, at operation 450, the method 400 comprises forming a mask layer on a top surface of the n transistor. In one or more embodiments, the mask layer comprises one or more of a hard mask layer and a photoresist layer. The hard mask layer may comprise any suitable material known to the skilled artisan. In one or more embodiments, the hard mask layer comprises silicon dioxide ($SiO_2$). The photoresist layer may comprise any suitable material known to the skilled artisan.

At operation 460, the method 400 comprises patterning a substrate to form at a second opening over the p transistor. In one or more embodiments, patterning the substrate comprises using one or more patterning techniques known to one of ordinary skill in the art of microelectronic device manufacturing.

At operation 470, the method 400 comprises selectively forming a molybdenum silicide (MoSi) layer on the titanium silicide (TiSi) layer on the p transistor. In one or more embodiments, after selectively forming the molybdenum silicide (MoSi) layer on the p transistor, a rapid thermal process (RTP) is performed. In one or more embodiments, the rapid thermal process (RTP) comprises heating the molybdenum silicide (MoSi) layer to a temperature in a range of about 500° C. to about 700° C. In one or more embodiments, the rapid thermal process (RTP) is performed for about 1 minute. In one or more embodiments, the rapid thermal process (RTP) removes unreacted metal from the molybdenum silicide (MoSi) layer.

In another aspect of the disclosure, a method 400 of forming the semiconductor structure includes reducing the contact resistance of the semiconductor structure. In some embodiments, at operation 480, annealing the semiconductor structure reduces the contact resistance. In one or more embodiments, annealing the semiconductor structure produces a smooth surface. In one or more embodiments, at operation 480, annealing the semiconductor structure forms one or more of ohmic and pseudo-ohmic contacts on the n transistor and on the p transistor.

The semiconductor structure can be annealed by any process known to a person skilled in the art. In some embodiments, the semiconductor structure is annealed by a rapid thermal process (RTP). In one or more embodiments, the rapid thermal process (RTP) comprises annealing the semiconductor structure to a temperature in a range of about 500° C. to about 700° C. In one or more embodiments, the rapid thermal process (RTP) comprises annealing the semiconductor structure to a temperature of about 600° C.

In some embodiments, the annealed semiconductor structure has a root mean square (RMS) roughness in a range of from 4% to less than 30%, from 4% to less than 20%, from 4% to less than 10%, from 10% to less than 30%, from 10% to less than 20% or from 20% to less than 30%.

At operation 490, the method 400 comprises filling the second opening with a second gapfill material. In some embodiments, filling the second opening comprises a bottom-up gap filling process. In other embodiments, filling the second opening comprises a conformal gap filling process. In one or more embodiments, the second gapfill material is substantially free of voids or seams. In one or more embodiments, the second gapfill material comprises one or more of tungsten (W), molybdenum (Mo), cobalt (Co) and ruthenium (Ru).

In one or more embodiments, the method 400 includes an optional post-processing operation.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A semiconductor structure comprising:

an n transistor comprising first dielectric sidewalls defining a filled first opening over a first source/drain material on a substrate, the filled first opening comprising a first gapfill material;

a p transistor comprising second dielectric sidewalls defining a filled second opening over a second source/drain material on the substrate, the filled second opening comprising a second gapfill material;

a first titanium silicide (TiSi) layer directly on the first source/drain material;

a second titanium silicide (TiSi) layer directly on the second source/drain material;

a first barrier layer lining the filled first opening directly on the first dielectric sidewalls and directly on the first titanium silicide (TiSi) layer;

a first molybdenum silicide (MoSi) layer directly on the first barrier layer in the filled first opening;

a second molybdenum silicide (MoSi) layer lining the filled second opening directly on the second dielectric sidewalls, and directly on the second titanium silicide (TiSi) layer; and a second barrier layer directly on the first molybdenum silicide (MoSi) layer and directly on the second molybdenum silicide (MoSi) layer, wherein the second barrier layer is configured to prevent oxide formation on the first molybdenum silicide (MoSi) layer and on the second molybdenum silicide (MoSi) layer.

2. The semiconductor structure of claim 1, wherein the first barrier layer is directly on the second titanium silicide (TiSi) layer and directly on the second dielectric sidewalls.

3. The semiconductor structure of claim 1, wherein the first barrier layer comprises one or more of titanium nitride (TiN), tantalum nitride (TaN), tungsten nitride (WN), or molybdenum nitride (MoN).

4. The semiconductor structure of claim 1, wherein the n transistor comprises silicon (Si) doped with phosphorous (P).

5. The semiconductor structure of claim 1, wherein the p transistor comprises silicon germanium (SiGe) doped with boron (B).

6. The semiconductor structure of claim 1, wherein the first gapfill material and the second gapfill material are independently substantially free of voids or seams.

7. The semiconductor structure of claim 1, wherein the first gapfill material and the second gapfill material independently comprise one or more of tungsten (W), molybdenum (Mo), cobalt (Co), or ruthenium (Ru).

8. The semiconductor structure of claim 1, wherein the first titanium silicide (TiSi) layer on the n transistor has a Schottky barrier height in a range of from about 0.4 eV to about 0.55 eV.

9. A semiconductor structure comprising:

an n transistor comprising first dielectric sidewalls defining a filled first opening over a first source/drain material on a substrate, the filled first opening comprising a first gapfill material;

a p transistor comprising second dielectric sidewalls defining a filled second opening over a second source/drain material on the substrate, the filled second opening comprising a second gapfill material;

a titanium silicide (TiSi) layer directly on the first source/drain material and not on the second source/drain material;

a molybdenum silicide (MoSi) layer directly on the second source/drain material;

a first barrier layer lining the filled first opening directly on the first dielectric sidewalls and directly on the titanium silicide (TiSi) layer; and a second barrier layer lining the filled second opening directly on the second dielectric sidewalls and directly on the molybdenum silicide (MoSi) layer.

10. The semiconductor structure of claim 9, wherein the first barrier layer and the second barrier layer independently comprises one or more of titanium nitride (TiN), tantalum nitride (TaN), tungsten nitride (WN), or molybdenum nitride (MoN).

11. The semiconductor structure of claim 9, wherein the n transistor comprises silicon (Si) doped with phosphorous (P).

12. The semiconductor structure of claim 9, wherein the p transistor comprises silicon germanium (SiGe) doped with boron (B).

13. The semiconductor structure of claim 9, wherein the first gapfill material and the second gapfill material are independently substantially free of voids or seams.

14. The semiconductor structure of claim 9, wherein the first gapfill material and the second gapfill material independently comprise one or more of tungsten (W), molybdenum (Mo), cobalt (Co), or ruthenium (Ru).

15. The semiconductor structure of claim 9, wherein the titanium silicide (TiSi) layer on the n transistor has a Schottky barrier height in a range of from about 0.4 eV to about 0.55 eV.

* * * * *